United States Patent [19]

Fang

[11] Patent Number: 5,099,299
[45] Date of Patent: Mar. 24, 1992

[54] MODULATION DOPED BASE HETEROJUNCTION BIPOLAR TRANSISTOR

[75] Inventor: Frank F. Fang, Yorktown Heights, N.Y.

[73] Assignee: International Business Machines Corporation, Armonk, N.Y.

[21] Appl. No.: 538,625

[22] Filed: Jun. 15, 1990

[51] Int. Cl.$^5$ .................. H01L 29/72; H01L 29/161; H01L 29/12
[52] U.S. Cl. ........................................ 357/34; 357/16; 357/58
[58] Field of Search .............................. 357/34, 16, 58

[56] References Cited
U.S. PATENT DOCUMENTS
4,825,269  4/1989  Plummer et al. ...................... 357/34

Primary Examiner—Mark Prenty
Attorney, Agent, or Firm—Scully, Scott, Murphy & Presser

[57] ABSTRACT

A modulation doped base heterojunction bipolar transistor wherein the base is a modulation doped heterojunction formed of a layer of p wide gap semiconductor material and a layer of I narrow gap semiconductor material. The collector/base is formed with n+ narrow gap semiconductor material adjacent to the I region of the base. The emitter is n+ wide gap semiconductor material adjacent to the p wide gap layer of the base. The doping concentration and width of the p region of the base is such that all holes are depleted in that region, and a p type inversion layer is formed in the I narrow gap material at its interface with the p wide gap material. This structure provides a modulation doped base heterojunction bipolar transistor which exhibits low base resistance, enhanced performance at low temperatures, a built-in drift field, a reduced emitter injection barrier, no minority carrier storage effects in the base region, and a built-in hot electron effect.

3 Claims, 1 Drawing Sheet

5,099,299

MODULATION DOPED BASE HETEROJUNCTION BIPOLAR TRANSISTOR

BACKGROUND OF THE INVENTION

1. Field of the Invention

The present invention relates generally to a heterojunction bipolar transistor having a modulation doped base. More particularly, the subject invention pertains to a heterojunction bipolar transistor wherein the base is a modulation doped heterojunction formed of a layer of p wide gap material and a layer of I narrow gap material. The collector/base is formed with n+ doped narrow gap semiconductor material adjacent to the I region of the base. The emitter is n+ doped wide gap semiconductor material adjacent to the p wide gap layer of the base. The doping concentration and width of the p wide gap region of the base is such that all holes are depleted in that region, and a p type inversion layer is formed in the I narrow gap material at its interface with the p wide gap material.

2. Discussion of the Prior Art

Two major factors adversely affect the performance of modern bipolar transistors, namely: 1) reverse injection of minority carriers at the emitter/base junction and 2) increased base resistance for narrow base widths. The reverse injection of minority carriers at the emitter/base junction can be overcome by a wide energy gap emitter. The increased base resistance for narrow base widths can be overcome by heavy doping of the base region. However, a heavily doped base suffers from severe impurity scattering which does not reduce the base resistance commensurate with the doping concentration, and the problem becomes more severe at low temperatures because of increased impurity scattering cross section.

SUMMARY OF THE INVENTION

Accordingly, it is a primary object of the present invention to provide a modulation doped base heterojunction bipolar transistor which exhibits low base resistance, enhanced performance at low temperatures, a built-in drift field, a reduced emitter injection barrier, no minority carrier storage effects in the base region, and a built-in hot electron effect. This combination of features is not available in the prior art, and the subject invention is considered to be particularly advantageous for high end bipolar devices operating at low temperatures.

In accordance with the teachings herein, the present invention provides a modulation doped base heterojunction bipolar transistor wherein the base is a modulation doped heterojunction formed of a layer of p wide gap material and a layer of I narrow gap material, and the collector/base is formed with n+ narrow gap semiconductor material adjacent to the I region of the base. The emitter is n+ doped wide gap semiconductor material adjacent to p wide gap layer of the base. The doping concentration and width of the p wide gap region of the base is such that all holes are depleted in that region, and a p type inversion layer is formed in the I narrow gap material at its interface with the p wide gap material.

The modulation doped base heterojunction bipolar transistor of the present invention provides the following advantages, 1) A low base resistance is provided because the base is formed with a two dimensional (2D) hole gas layer which does not suffer from the usual prior art effects of impurity scattering by the base doping.

2) Enhanced performance is provided during low temperature operations as there is no carrier freeze out in the base, and also the hole mobility should be higher at low temperatures.

3) A built in drift field is provided in the base region for minority transport.

4) The emitter injection barrier is reduced from a conventional diffusion potential of a conventional pn junction because of the full depletion of the modulation doped p region. As a further advantage, the injection barrier can be adjusted as a design parameter by the modulation doping level and profile.

5) The base region has no minority carrier storage effects, which should provide a short recover time.

6) Additional kinetic energy of the injected minority carriers is provided in the emitter/base junction, which should enhance the minority carrier transport across the base.

BRIEF DESCRIPTION OF THE DRAWINGS

The foregoing objects and advantages of the present invention for a modulation doped base heterojunction bipolar transistor may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
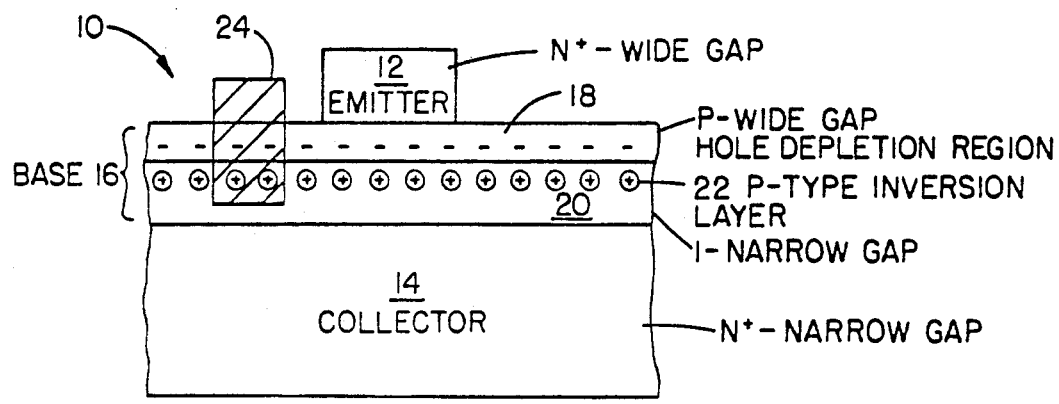
FIG. 1 is a sectional view of an exemplary embodiment of a modulation doped base heterojunction bipolar npn transistor constructed pursuant to the teachings of the present invention.

Referring to the drawings in detail, FIG. 1 illustrates a sectional view of an exemplary embodiment of a modulation doped base heterojunction bipolar transistor 10 constructed pursuant to the teachings of the present invention. The transistor is formed by an n+ wide gap emitter 12 separated from an n+ narrow gap collector 14 by a modulation doped p-I heterojunction base 16. The base 16 is a heterostructure formed by a layer 18 of p wide gap semiconductor material and a layer 20 of I narrow gap semiconductor material. The doping concentration and width of the p wide gap region 18 is such that all holes are depleted in that region, and a p type inversion layer 22 with holes is formed in the I narrow gap material at its interface with the p wide gap material.

The n+ wide gap emitter is adjacent to the p wide gap layer of the base, and the n+ narrow gap collector is adjacent to the I narrow gap layer of the base. A base contact electrode 24 is provided extending through to the base.

Figure 2:
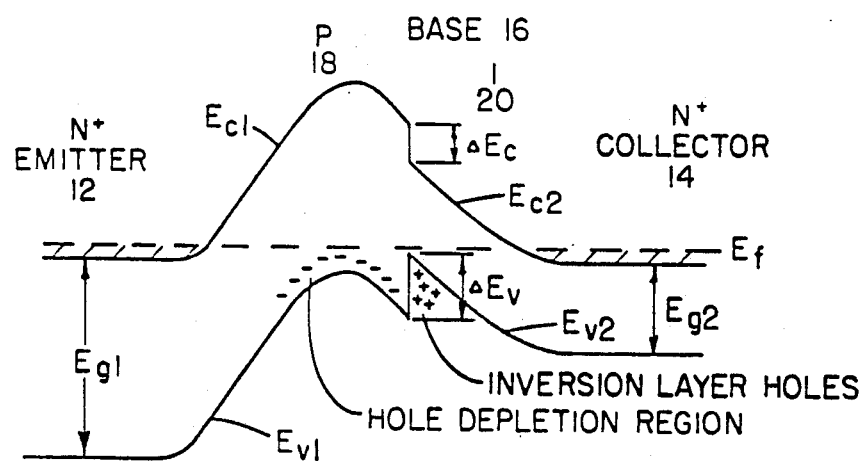
FIG. 2 illustrates an energy band diagram of the transistor of the present invention showing the effects of the modulation doped p-I heterojunction base on the energy bands.

FIG. 2 is a schematic energy band diagram for the npn transistor of FIG. 1. The conduction energy band is indicated at Ec, and the valence energy band is indicated at Ev. The wide energy gap in the emitter region is shown as Eg1, and the narrow energy gap in the collector region is shown as Eg2. At the interface of the wide and narrow gap semiconductors, the conduction and valence band edges are discontinuous with energy offsets $\Delta E_c$ and $\Delta E_v$ for the conduction and valence bands respectively. The energy gap in the base region proceeds abruptly from a wide gap in the p layer to a narrow gap in the I layer, with a hole depletion region being formed in p wide gap material, and a p type inversion layer being formed in the I narrow gap material at its interface with the p wide gap material. FIG. 2 illustrates the hole depletion region and the adjacent p type inversion layer 22.

It is well known that transistors having a wide band gap emitter have important advantages in bipolar transistor technology. The wide band gap emitter in an npn transistor provides high emitter injection efficiency by blocking the movement of holes from the base to the emitter for the same electron injection from the emitter to the base. Consequently, it normally allows relatively lighter emitter doping and heavier base doping which results in reduced emitter capacitance and lower base resistance.

The heterojunction bipolar transistor of the present invention may be fabricated by conventional techniques with any semiconductor material such as silicon, germanium, or gallium arsenide, and should present no unusual fabrication or construction problems.

The transistor 10 of FIG. 1 is shown illustratively as an npn transistor. It should be obvious to those skilled in the art that the implementation of the present invention may also be provided in a pnp transistor with a symmetrically reversed structure. In this embodiment of the present invention, a complementary modulation doped base heterojunction bipolar transistor can be fabricated with the emitter being formed of p+ wide gap semiconductor material, the collector being formed of p+ narrow gap semiconductor material, and the wide gap region of the base being formed of n wide gap semiconductor material.

The modulation doped base heterojunction bipolar transistor of the present invention provides the following significant advantages.

1) The base 16 has a low base resistance because it has a two dimensional (2D) hole gas layer resulting from the modulation doping. It does not suffer from the usual prior art effect of impurity scattering caused by the base doping. The impurity in the present case is due to remote ions in the p-wide gap material which is considerably less effective for scattering.

2) Enhanced performance is provided during low temperature operations as there is no carrier freeze out in the base 16, and also the hole mobility should be higher at low temperatures. The concept of carrier freeze out is well known in the semiconductor arts, and the concept can be explained qualitatively as follows. The number of ionized acceptors in a sample depends exponentially on the difference between the Fermi level and the acceptor ionization energy. As temperatures are reduced, the Fermi level moves closer to the band edge, and conditions begin to become energetically favorable for the acceptors to remain neutral rather than become ionized. This neutralization of the acceptors removes holes from the valence band that were previously available for conduction, and thereby lowers the sample conductivity.

3) A built in drift field is provided in the base region for minority transport.

4) The emitter injection barrier is reduced from the conventional diffusion potential of a typical pn junction because of the full depletion of the modulation doped p region. As a further advantage, the injection barrier can be adjusted by the modulation doping level and profile as a design parameter.

5) The base region has no minority carrier storage effects, which should provide a short recover time.

6) Additional kinetic energy of the injected minority carriers is provided in the emitter/base junction caused by the conduction band edge offset $\Delta E_c$ between the wide and narrow gap materials, which should enhance the minority carrier transport across the base.

While several embodiments and variations of the present invention for a modulation doped base heterojunction bipolar transistor are described in detail herein, it should be apparent that the disclosure and teachings of the present invention will suggest many alternative designs to those skilled in the art.

What is claimed is:

1. A modulation doped base heterojunction bipolar transistor comprising:
   a. an emitter formed of a wide energy gap semiconductor material;
   b. a collector formed of a narrow energy gap semiconductor material;
   c. a modulation doped heterojunction base separating said emitter and collector and comprising a layer of wide energy gap semiconductor material adjacent to said emitter, and a layer of narrow energy gap I semiconductor material adjacent to said collector, wherein the doping concentration and width of the wide energy gap semiconductor material of the base is such that all holes are depleted therein and an inversion layer is formed in the narrow energy gap I semiconductor material at its interface with the wide energy gap semiconductor material.

2. A modulation doped base heterojunction bipolar transistor as claimed in claim 1, said emitter being formed of n+ wide energy gap semiconductor material, said collector being formed of n+ narrow energy gap semiconductor material, and said wide energy gap semiconductor material of the base being formed of p wide energy gap semiconductor material, and the modulation doped base heterojunction bipolar transistor exhibiting low base resistance, enhanced performance at low temperature, a built-in drift field, a reduced emitter injection barrier, no minority carrier storage effects in the base region, and a built-in hot electron effect.

3. A modulation doped base heterojunction bipolar transistor as claimed in claim 1, said emitter being formed of p+ wide energy gap semiconductor material, said collector being formed of p+ narrow energy gap semiconductor material, and said wide energy gap semiconductor material of the base being formed of n wide energy gap semiconductor material, and the modulation doped base heterojunction bipolar transistor exhibiting low base resistance enhanced performance at low temperature, a built-in drift field, a reduced emitter injection barrier, no minority carrier storage effects in the base region, and a built-in hot hole effect.

* * * * *